(12) United States Patent
Lesso

(10) Patent No.: US 10,904,684 B2
(45) Date of Patent: Jan. 26, 2021

(54) ACTIVITY DETECTION

(71) Applicant: Cirrus Logic International Semiconductor Ltd., Edinburgh (GB)

(72) Inventor: John Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 40 days.

(21) Appl. No.: 16/190,455

(22) Filed: Nov. 14, 2018

(65) Prior Publication Data

US 2019/0158971 A1 May 23, 2019

Related U.S. Application Data

(60) Provisional application No. 62/587,899, filed on Nov. 17, 2017.

(30) Foreign Application Priority Data

Dec. 7, 2017 (GB) .................................. 1720410.8

(51) Int. Cl.
*H03K 3/0233* (2006.01)
*G04F 10/00* (2006.01)
(Continued)

(52) U.S. Cl.
CPC ......... *H04R 29/004* (2013.01); *G04F 10/005* (2013.01); *H03K 3/02337* (2013.01); *H03K 7/08* (2013.01); *H03M 1/50* (2013.01)

(58) Field of Classification Search
CPC ... H04R 29/004; H04R 29/007; G04F 10/005; H03K 3/02337; H03K 7/08; H03M 1/50; H03M 1/64
(Continued)

(56) References Cited

U.S. PATENT DOCUMENTS 4,975,657 A 12/1990 Eastmond
2006/0226798 A1* 10/2006 Lelkes .................. H02M 3/158
315/360

(Continued)

FOREIGN PATENT DOCUMENTS

GB 1343869 A 1/1974
WO WO 01/29821 A1 4/2001

OTHER PUBLICATIONS

Combined Search and Examination Report under Sections 17 and 18(3), UKIPO, Application No. GB1720410.8, dated Jun. 5, 2018.

*Primary Examiner* — Vivian C Chin
*Assistant Examiner* — Con P Tran
(74) *Attorney, Agent, or Firm* — Jackson Walker L.L.P.

(57) ABSTRACT

This application relates an activity detector (100) for detecting signal activity in an input audio signal ($S_{IN}$), such as may be used for always-on speech detection. The activity detector has a first time-encoding modulator (TEM) 101 including a first hysteretic comparator (201) for generating a PWM (pulse-width modulation) signal based on the input audio signal. A second TEM (103) having a second hysteretic comparator (401) is arranged to receive a reference voltage ($V_{MID}$) and generate a clock signal ($S_{CLK}$). A time-decoding converter (102) receives the clock signal and generates count values of a number of cycles of the clock signal in periods defined by the PWM signal. An activity monitor (104) is responsive to a count signal ($S_{CT}$) from the TDC 102 to determine whether the input audio signal comprises signal activity above a defined threshold.

18 Claims, 3 Drawing Sheets

(51) Int. Cl.
*H04R 29/00* (2006.01)
*H03M 1/50* (2006.01)
*H03K 7/08* (2006.01)

(58) Field of Classification Search
USPC ..... 381/56, 110, 98, 111, 238, 122; 327/205
See application file for complete search history.

(56) References Cited

U.S. PATENT DOCUMENTS

| | | | | |
|---|---|---|---|---|
| 2007/0247876 | A1* | 10/2007 | Garabandic | H02M 1/12 |
| | | | | 363/17 |
| 2007/0286273 | A1* | 12/2007 | Clara | H03F 3/217 |
| | | | | 375/238 |
| 2013/0038300 | A1* | 2/2013 | Yanagida | H02M 3/1563 |
| | | | | 323/271 |
| 2016/0066113 | A1* | 3/2016 | Elkhatib | G06F 3/167 |
| | | | | 381/56 |
| 2016/0126968 | A1* | 5/2016 | Lesso | H03M 1/18 |
| | | | | 341/155 |

* cited by examiner

ACTIVITY DETECTION

TECHNICAL FIELD

The field of representative embodiments of this disclosure relates to methods, apparatus and/or implementations concerning or relating to detecting activity in the form of an audio signal.

BACKGROUND

There is a trend, for some contemporary electronic devices, to provide an ability for voice control, such that a user can speak commands that control some aspect of the device operation. In some instances a user may enable voice control only periodically, for instance by operating some physical control, e.g. pressing a button on a touch sensitive interface, and then speaking the relevant command. However having to physically interact with some controller detracts from some of the convenience of voice control and it may be desirable to allow a hand-free user experience.

Some devices may therefore provide an always-on voice control functionality such that a user could issue a voice command at any time. In some implementations, to avoid the device responding to speech which is not intended as a valid voice command from the user of the device, the device may only respond to a command if preceded by a valid trigger word or phrase, e.g. an assigned name.

To allow for the processing of a user's speech the device may therefore have a speech recognition module for processing speech audio to determine the words spoken in such speech. Some devices may also have a speaker recognition module for analysing the speech audio to determine whether the speech corresponds to a particular pre-enrolled user, e.g. for biometric security and/or for contextual control. To receive speech audio the device will typically comprise a microphone and/or means of receiving an audio signal from a microphone of an associated accessory apparatus. In some instances the microphone may provide an analogue audio signal, and thus the device may comprise an analogue-to-digital converter (ADC) for converting the received analogue audio signal into a corresponding digital signal for processing by the speech recognition module and/or speaker recognition module. In some instances however digital audio signals may be received, say from a digital microphone of the device or from an associated accessory apparatus.

To provide the always-on functionality the microphone will be continually active to provide an audio signal, i.e. the device will be continually listening, via the microphone, for commands. However, in general, power consumption of electronic devices may be a concern, especially for devices that may be operable with a battery power supply and the speech recognition module, and speaker recognition module if present, may consume a relatively significant amount of power in use. To save power it is thus generally desirable that the speech recognition module, and speaker recognition module if present, are only used to process audio signals that are likely to correspond to speech.

It is therefore known to operate with the speech/speaker recognition module(s) being unpowered, or in a low-power standby mode, and to have a voice-activity-detector (VAD) module monitor the audio signal from the microphone for any activity of interest that may be speech.

For analogue audio signals the VAD module could have front-end circuitry that includes an analogue activity detector for comparing the analogue audio signal with at least one threshold voltage to detect any signal component above the threshold. In the event of any significant activity, back-end circuitry of the VAD module could be enabled which may include an ADC and possibly some processing to analyse the signal to detect whether it corresponds to speech or specifically the trigger phrase.

In practice however it can take time for the back-end processing to turn-on/wake-up and become fully operational. This may mean there may be a delay between activity being detected in the audio signal received from the microphone and the back-end circuitry being ready to analyse the audio signal. Such a delay could mean that at least part of the audio signal of interest may effectively be lost, which could include part of the relevant trigger phase.

In some embodiments an analogue audio signal may be converted to an equivalent digital audio signal by a suitable ADC as part of the always-on front-end circuitry. The output of the ADC may be supplied to both a digital activity detector and a buffer, i.e. memory. When the digital activity detector determines signal activity of interest the back-end processing circuitry can be powered-up and can operate using data stored in the buffer. In this way no audio data is lost. This does however require an ADC to be operating continually which will consume power and there is an increasing desire for low power operation.

SUMMARY

Embodiments of the present invention relate to methods and apparatus for activity detection, e.g. for detecting signal activity in an audio signal, which at least mitigate at least some of the above mentioned issues.

According to some embodiments there is provided an activity detector for detecting signal activity in an input audio signal comprising:
- a first time-encoding modulator comprising a first hysteretic comparator for generating a PWM (pulse-width modulation) signal based on the input audio signal;
- a second time-encoding modulator comprising a second hysteretic comparator for receiving a reference voltage and generating a clock signal based on the reference voltage;
- a time-decoding converter configured to receive the clock signal, generate count values of a number of cycles of the clock signal in periods defined by the PWM signal and output a count signal based on said count values; and
- an activity monitor responsive to the count signal to determine whether the input audio signal comprises signal activity above a defined threshold.

In some embodiments the second time-encoding modulator is configurable so as to vary the frequency of the clock signal. The activity detector may be configured so as to operate in a first mode, with the second time-encoding modulator controlled to generate the clock signal at a first frequency, when the input audio signal comprises no signal activity above the defined threshold. The activity detector may be configured so as to operate in a second mode, with the second time-encoding modulator controlled to generate the clock signal at a second, higher, frequency when signal activity above the defined threshold is detected.

In some embodiments there may be a timing controller for controlling a timing parameter of the first time-encoding modulator in the second mode of operation. The timing parameter of the first time-encoding modulator may comprise frequency limits for the maximum and/or minimum frequency of the PWM signal. The timing controller may comprise a first hysteresis controller for controlling hysteresis applied by the first hysteretic comparator. In the second mode of operation, the first hysteresis controller may be responsive to the time-decoding converter to control the hysteresis applied by the first hysteretic comparator so as to maintain the frequency of the PWM signal within said frequency limits. The timing parameter may additionally or alternatively comprise the timing of signal transitions in the PWM signal. In the second mode of operation the timing controller may be configured to synchronise any signal transitions in the PWM signal to said clock signal. The first hysteretic comparator may comprise a latched hysteretic comparator module. In the second mode, the timing controller may be configured to supply the clock signal to the latched hysteretic comparator module.

The reference voltage may correspond to a voltage level of zero signal magnitude of the audio input signal.

The second time-encoding modulator may comprise a second hysteresis controller for controlling hysteresis applied by the second hysteretic comparator so as to control the frequency of the clock signal. The second time-encoding modulator may comprises a loop filter. At least one component of the loop filter of the second time-encoding modulator may be configurable so as to vary a time-constant of the loop filter so as to control the frequency of the clock signal.

The activity detector may further comprise a buffer configured to receive a version of the count signal from the time-decoding converter. The activity monitor may be configured to disable the buffer when the input audio signal comprises no signal activity above the defined threshold and to enable the buffer when the input audio signal comprises signal activity above the defined threshold.

In some embodiments the activity monitor may be configured to receive the count signal and monitor a value related to a cycle period of the PWM signal derived from the count signal against a threshold.

The activity detector may be implemented as an integrated circuit.

Aspects also relate to an audio circuit with an activity detector according to any of the variants discussed herein. The audio circuit may include a microphone configured to provide the input audio signal to the activity detector. An analogue-to-digital converter may be configured to be enabled by the activity detector when the activity monitor indicates that the input audio signal comprises signal activity above the defined threshold. There may be a processing module configured to be enabled by the activity detector when the activity monitor indicates that the input audio signal comprises signal activity above the defined threshold. The processing module may comprise a speech processing module.

Aspects also relate to an electronic device comprising an activity detector according to any of the variants discussed herein or an audio circuit as discussed above. The device may be at least one of: a portable device; a battery powered device; a voice controlled device; a communication device; a mobile or cellular telephone; a smartphone; a computing device; a notebook, laptop or tablet computing device; a wearable device; a smartwatch; a gaming device; a personal media player; a domestic appliance.

Aspects also relate to a method of detecting signal activity in an input audio signal comprising:
generating a PWM (pulse-width modulation) signal based on the input audio signal using a first time-encoding modulator comprising a first hysteretic comparator;
generating a clock signal using a second time-encoding modulator comprising a second hysteretic comparator for receiving a reference voltage;
generating count values of a number of cycles of the clock signal in periods defined by the PWM signal and outputting a count signal based on said count values; and
monitoring the count signal to determine whether the input audio signal comprises signal activity above a defined threshold.

Aspects also relate to an activity detector for detecting signal activity in an input audio signal comprising:
a first time-encoding modulator configured to receive the input audio signal as an input and generate a first PWM (pulse-width modulation) signal based on the input audio signal;
a second time-encoding modulator configured to receive a reference voltage and generate a second PWM signal as a clock signal;
a time-decoding converter for counting a number of cycles of the clock signal in periods defined by the first PWM signal;
an activity monitor responsive to the time-decoding converter to determine whether or not the input audio signal comprises signal activity above a defined threshold.

The first and second time-encoding modulators may each comprise: a hysteretic comparator; and a loop filter. The activity detector may be configured to control a parameter of the hysteretic comparator or the loop filter of the second time-encoding modulators so as to controllably vary the frequency of the clock signal based on the determination whether or not the input audio signal comprises signal activity above a defined threshold.

Aspects also relate to an activity detector for detecting signal activity in an input audio signal comprising:
a first time-encoding modulator configured to receive the input audio signal as an input and generate a first PWM (pulse-width modulation) signal based on the input audio signal;
a second time-encoding modulator configured to receive a reference voltage and generate a second PWM signal as a clock signal;
a time-decoding converter for counting a number of cycles of the clock signal in periods defined by the first PWM signal; and
an activity monitor responsive to the time-decoding converter to determine whether or not the input audio signal comprises signal activity above a defined threshold and, in the event that signal activity above the defined threshold is detected, to control the second time-encoding modulator to increase the frequency of the clock signal.

Aspects also relate to an activity detector for detecting signal activity in an input audio signal comprising:
a first time-encoding modulator configured to generate a PWM (pulse-width modulation) signal based on the input audio signal wherein the cycle period of the PWM signal varies with the magnitude of the input audio signal;
an activity monitor for determining whether the input audio signal comprises signal activity above a defined threshold based on the cycle period of the PWM signal; and
a timing controller responsive to said activity monitor for controlling a timing parameter of the first time-encoding modulator.

Aspects also relate to an activity detector for detecting signal activity in an input audio signal comprising:
- a first time-encoding modulator for generating a PWM (pulse-width modulation) signal based on the input audio signal;
- a time-decoding converter configured to receive a clock signal, generate count values of a number of cycles of the clock signal in periods defined by the PWM signal and output a count signal based on said count values;
- a buffer for buffering the count signal output from the time-decoding converter; and
- an activity monitor responsive to the count signal to determine whether the input audio signal comprises signal activity above a defined threshold; wherein the activity monitor is configured to disable the buffer when the input audio signal comprises no signal activity above a defined threshold and no enable the buffer when the input audio signal comprises signal activity above a defined threshold.

Aspects also relate to processing circuitry for detecting voice activity in an input audio signal comprising:
- a first modulator for generating a PWM signal based on the input audio signal;
- a second modulator for generating a clock signal based on a reference voltage;
- a converter configured to receive the PWM signal and the clock signal and generate a converter signal representing the number of cycles of the clock signal in periods defined by the PWM signal; and
- an activity monitor responsive to the converter signal to determine whether the input audio signal comprises voice activity above a defined threshold.

BRIEF DESCRIPTION OF DRAWINGS

For a better understanding of examples of the present disclosure, and to show more clearly how the examples may be carried into effect, reference will now be made, by way of example only, to the following drawings in which.

DETAILED DESCRIPTION OF EMBODIMENTS

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the present disclosure relate to methods and apparatus for activity detection, especially for detection of signal activity in audio signals.

Figure 1:
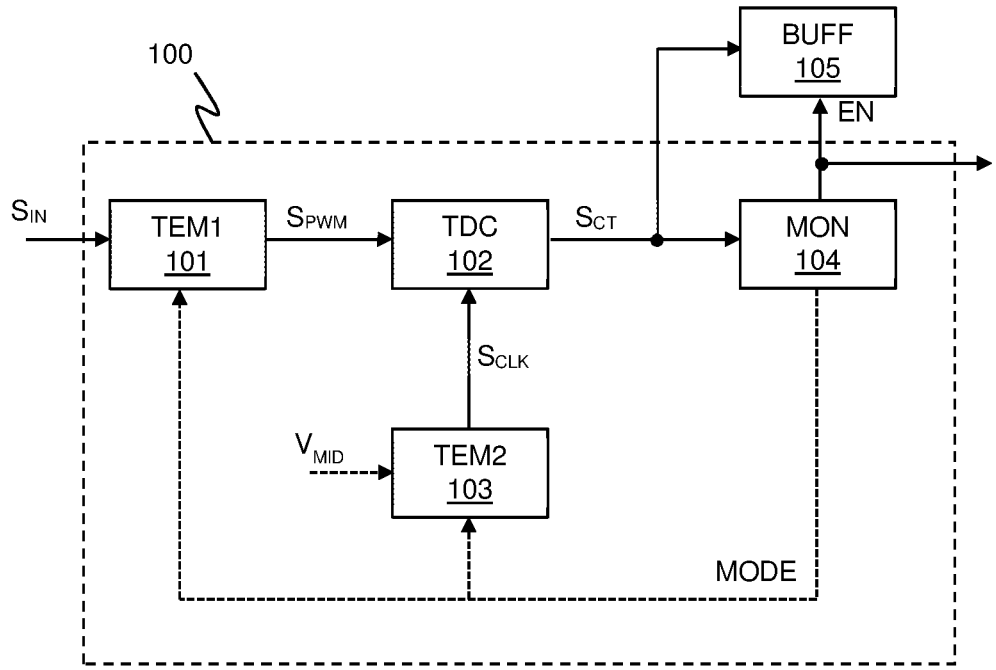
FIG. 1 illustrates an activity detector according to an embodiment.

FIG. 1 illustrates an activity detector 100 according to one embodiment. The activity detector 100 comprises a first time-encoding modulator (TEM) 101 for receiving an input signal $S_{IN}$, which may for instance be an input analogue audio signal received from a microphone, and generating a corresponding time-encoded signal. In at least some embodiments of the disclosure the time-encoded signal is a pulse-width modulated (PWM) signal $S_{PWM}$ that alternates between different signal levels to encode the signal level of the input signal $S_{IN}$ by the proportion of time spent in each output state. Typically the PWM signal $S_{PWM}$ may swap between first and second output states and the signal level of the input signal may be encoded by the duty cycle of a first output state, i.e. the proportional of the overall cycle period that corresponds to the first output state, or equivalently the amount of time that the PWM signal $S_{PWM}$ spends in the first output state compared to the second output state.

The PWM signal $S_{PWM}$ is input to a demodulator or time-decoding-converter (TDC) 102. The TDC 102 is arranged to receive a clock signal $S_{CLK}$ from a clock generator 103, which in embodiments of the disclosure comprises a second time-encoding modulator (TEM), and to effectively count the number of clock cycles, e.g. pulses, of the clock signal $S_{CLK}$ in periods defined by the PWM signal $S_{PWM}$. The TDC 102 outputs a count signal $S_{CT}$ based on the count values in respect of the PWM signal $S_{PWM}$ periods. This count signal $S_{CT}$ is input to an activity monitor 104 which, based on the count signal $S_{CT}$, i.e. based on the PWM signal $S_{PWM}$ periods, determines whether there is any signal activity of interest in the input signal $S_{IN}$. In the event that the activity monitor 104 detects signal activity of interest it may generate a control signal EN to wake or enable other circuit elements.

This arrangement can provide a low power activity detector that can readily respond to any signal activity and would be suitable for use with, or as part of, a voice activity detect circuit. There are various advantageous ways in which the activity detector may be implemented which represent particular aspects of embodiments of the present disclosure.

In some embodiments the TEM 101 may comprise a hysteretic comparator and loop filter for generating the PWM signal. Such an arrangement can provide a very low power and compact modulator arrangement and thus allow the activity detector to operate in a very low power mode.

In some embodiments the second time-encoding modulator 103 may advantageously comprise a modulator topology which is substantially the same as the first time-encoding modulator, TEM1 101. This can provide an arrangement with a good immunity to common mode issues, e.g. such as arising from process or temperature variations. The input signal $S_{IN}$ may typically be referenced to a midpoint voltage $V_{MID}$ such that an input signal $S_{IN}$ of zero magnitude corresponds to the midpoint voltage $V_{MID}$ and results in a duty cycle of 50% from TEM 101. The midpoint voltage $V_{MID}$ may be provided as an input to the clock generator TEM 103 so as to generate the clock signal $S_{CLK}$. This also provides good performance with respect to power supply variations, e.g. good PSRR, as any such variations would affect the input signal $S_{IN}$ and the reference voltage $V_{MID}$.

In some embodiments the activity detector 100 may be operable in a plurality of modes, for instance at least a first mode M1 where the clock signal $S_{CLK}$ from the clock generator TEM 103 has a first frequency F1 and a second mode M2 where the clock signal $S_{CLK}$ from the clock generator TEM 103 has a second, higher frequency F2, i.e. F2>F1. The first mode may be used when no signal activity of interest is detected and the second mode may be used when signal activity of interest is detected. The first and second modes M1 and M2 may thus effectively enable a first, low-power but relatively low resolution mode M1 which is sufficient to allow determination as to whether there is any signal activity of interest. If signal activity if interest is detected the activity detector can rapidly switch to a higher resolution mode M2 to provide information about the input signal $S_{IN}$ that may allow data regarding the noise floor of the signal $S_{IN}$ to be determined. In some embodiments there may be at least one further mode of operation, e.g. a third mode of higher performance M3.

In some embodiments a buffer, or memory, 105 may be arranged to receive the count signal $S_{CT}$ and store samples of $S_{CT}$, but the buffer 105 may only be enabled by the activity monitor 104 if signal activity of interest is detected. If no signal activity of interest is detected then the buffer 105 may be disabled and thus may consume substantially no, or only very limited, power. Thus no signal is buffered, i.e. stored, when there is no input signal $S_{IN}$ component above the noise floor of the microphone system. This can advantageously save power in terms of not buffering a signal that corresponds to noise.

These and other advantageous aspects of the activity detector of embodiments of the disclosure will be described in more detail below.

Figure 2:
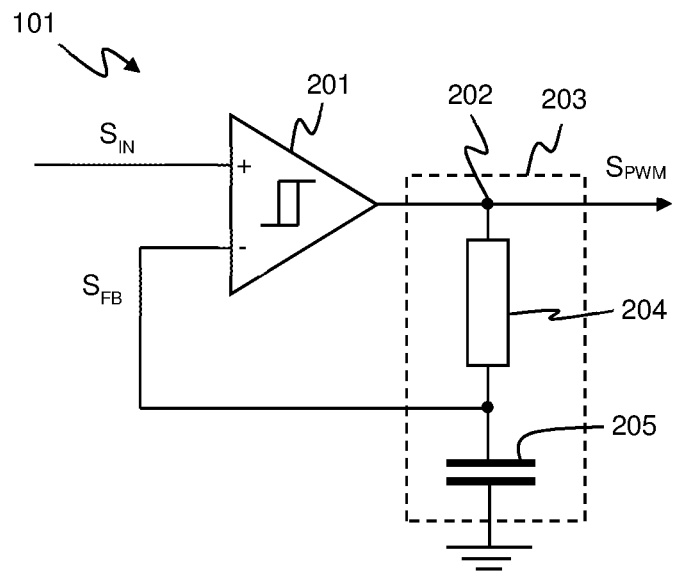
FIG. 2 illustrates a hysteretic comparator time-encoding modulator.

FIG. 2 illustrates one example of a time-encoding modulator (TEM) which may advantageously be used as the first time-encoding modulator (TEM1) 101 in an embodiment. As mentioned above the first time-encoding modulator (TEM1) 101 may advantageous comprise a hysteretic comparator 201.

In this embodiment the hysteretic comparator 201 is arranged to receive the input signal $S_{IN}$ at a first comparator input, in this example input (+). The hysteretic comparator 201 compares the input signal $S_{IN}$ at the first comparator input with a feedback signal $S_{FB}$ received at a second comparator input, in this example input (−), and applies hysteresis to the comparison to generate the PWM signal $S_{PWM}$ at a comparator output node 202. A feedback path also extends from the comparator output node 202 to the second comparator input for providing the feedback signal $S_{FB}$ to the second comparator input. A loop filter arrangement 203 is arranged to apply filtering to the feedback path to provide the feedback signal $S_{FB}$.

The hysteretic comparator 201 compares the signals at the first and second comparator inputs, i.e. the input signal $S_{IN}$ and the feedback signal $S_{FB}$, and outputs either of two output states, $V_H$ and $V_L$, depending on the result of the comparison. The hysteretic comparator 201 is operable to apply hysteresis to the comparison such that a differential voltage between the signals $S_{IN}$ and $S_{FB}$ at the first and second comparator inputs must be greater (i.e. more positive or less negative) than a first threshold to transition from one output state to the other, say from output state $V_L$ to the output state $V_H$, but must be lower (i.e. less positive or more negative) than a second, different threshold to make the opposite transition, e.g. to swap from the output state $V_H$ to the output state $V_L$. The difference between these first and second thresholds corresponds to the amount of hysteresis applied. In some implementations the first and second thresholds may be equal in magnitude and opposite in polarity, i.e. the difference between the input signal $S_{IN}$ and the feedback signal $S_{FB}$ must be greater than an amount +H to transition to one state, say $V_H$, and must be lower than −H to transition to the other state, say $V_L$. In this instance the magnitude of H can be seen as a measure of the hysteresis applied by the hysteretic comparator 201 and the hysteresis applied is symmetric. It will be understood however that the hysteresis applied could be asymmetric in some implementations.

In some embodiments the output states $V_H$ and $V_L$ may be high and low voltage levels respectively, for instance a supply voltage $V_{DD}$ ($V_H$) and ground ($V_L$), or a positive voltage V+ ($V_H$) and a negative voltage V− ($V_L$), possibly of equal magnitude. Thus the PWM signal $S_{PWM}$ transitions between two output voltage states.

The input signal $S_{IN}$ is thus compared to the feedback signal $S_{FB}$ which is derived from the output PWM signal $S_{PWM}$. The feedback signal $S_{FB}$ corresponds to a filtered version of the PWM signal $S_{PWM}$ and the filter arrangement 203 provides some delay and signal averaging over time. Thus if the PWM signal $S_{PWM}$ transitions to the high state $V_H$, the feedback signal $S_{FB}$ will, initially, be lower than the present state of the PWM signal $S_{PWM}$ and will begin to increase, i.e. become more positive, over a period of time. If the input signal $S_{IN}$ is itself relatively constant over that period of time the difference between the input signal $S_{IN}$ and the feedback signal $S_{FB}$ will decrease, i.e. become less positive/more negative, until the relevant threshold is reached and the PWM signal $S_{PWM}$ transitions to the other output state $V_L$. At this point the value of the feedback signal $S_{FB}$ will start to decrease. The hysteretic comparator 201 will maintain the low state $V_L$ until the difference between the input signal $S_{IN}$ and the feedback signal $S_{FB}$ increases, i.e. becomes less negative/more positive, to the second threshold.

Note that the arrangement illustrated in FIG. 2 assumes that the input signal $S_{IN}$ will vary within a range within the voltage range of the output state $V_H$ and $V_L$ and is referenced to a midpoint voltage $V_{MID}$ which is equal to the midpoint voltage between $V_H$ and $V_L$. If necessary level shifting and/or scaling could be applied to at least one of the input signal $S_{IN}$ or feedback signal $S_{FB}$.

Thus if the input signal $S_{IN}$ maintains a relatively constant level the output of the hysteretic comparator 201 will continually cycle between the first and second output states $V_H$ and $V_L$. The time spent in each output state will depend on how long it takes for the feedback signal $S_{FB}$ to change by the amount defined by the hysteresis, e.g. from a value equal to $S_{IN}$−H to a value $S_{IN}$+H or vice versa. This will depend on the amount of hysteresis and the rate of change of the feedback signal $S_{FB}$. However the rate of change of the feedback signal $S_{FB}$ will depend on the then-current value of the feedback signal $S_{FB}$, in particular the difference between the level of the output state, i.e. $V_H$ or $V_L$, and the value of the feedback signal $S_{FB}$, which in turn depends on the level of the input signal $S_{IN}$.

The duration of a pulse corresponding to the high state $V_H$ in the PWM signal $S_{PWM}$ (and correspondingly the duration of a pulse corresponding to the low state $V_L$ in the PWM signal $S_{PWM}$) thus depends on the level of the input signal $S_{IN}$. The first TEM 101 encodes the input signal $S_{IN}$ as the duty cycle of the PWM signal $S_{PWM}$, i.e. the ratio between the duration of a pulse of a first output state, say $V_H$, to the duration of the cycle period.

Figure 3:
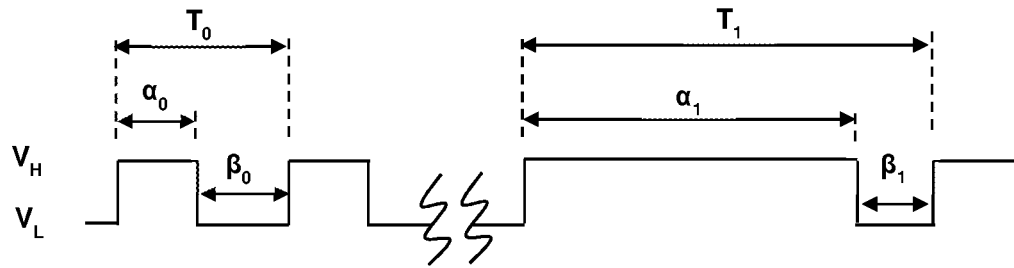
FIG. 3 illustrates an example output PWM signal.

FIG. 3 illustrates the principles of the PWM signal $S_{PWM}$ of a first time encoding modulator (TEM1) 101 such as illustrated in FIG. 2. The PWM signal $S_{PWM}$ varies between the two output states $V_H$ and $V_L$. The duration of a pulse of the high state $V_H$ is denoted by α and the duration of a pulse of the low state $V_L$ is denoted by β. The cycle period T is equal to α+β. For cycles which do not correspond to duty cycles of 100% or 0% the cycle period T can also be seen as the period between an instance of a transition from one output state to the other output state and the next instance of the same transition.

As described above the duration a of the pulse of the high state $V_H$ depends on the level of the input signal $S_{IN}$, as does the duration of the pulse of the low state $V_L$. For signals of zero magnitude (which corresponds to a signal reference voltage value equal to the midlevel voltage $V_{MID}$ between $V_H$ and $V_L$) the periods of the pulses of each state, illustrated in FIG. 2 as $\alpha_0$ and $\beta_0$, will be equal to one another, i.e. each equal to $T_0/2$ where $T_0$ is the cycle period at zero magnitude. If the magnitude of the input signal $S_{IN}$ increases the duration of the pulse of one state will increase and the duration of the pulse of the other state will decrease to first order by:

$$\alpha = T_0/2.(1-X) \quad \beta = T_0/2.(1+X) \qquad (\text{eqn. 1})$$

where X is the level of the normalised input signal, i.e.

$$X = S_{IN}/S_{MAX} \qquad (\text{eqn. 2})$$

where $S_{MAX}$ is the maximum magnitude of the input signal defined as $(V_H - V_L)/2$. It will be appreciated that increase in duration of one pulse is not equal to the decrease in duration of the other pulse and the overall cycle period T will change:

$$T = \alpha + \beta = T_0/(1-X^2) \qquad (\text{eqn. 3})$$

Thus any increase in the magnitude of the input signal will result in an increase in the cycle period, as illustrated by the durations $\alpha_1$ and $\beta_1$ and duration $T_1$ for a cycle period at a non-zero input signal magnitude. Thus the cycle period $T_0$ (equal to $\alpha_0 + \beta_0$) corresponding to an input signal of zero magnitude will be the cycle period of shortest duration. This condition is referred to as the limit cycle and the period $T_0$ is the limit cycle period. This corresponds to the fastest cycle frequency $f_0 = 1/T_0$ which is referred to as the limit cycle frequency.

Referring back to FIG. 2, in this embodiment the loop filter arrangement 203 comprises a resistive-capacitive (RC) filter having an impedance 204 in the feedback path and a capacitance 205 coupled between the feedback path and a reference voltage, e.g. ground. Whilst the filter arrangement 203 may be implemented using resistors and capacitors as illustrated, other RC components such as FET based resistances and/or capacitances may be used in some implementations.

As noted above the output is a voltage waveform that has a limit cycle period of $T_0$ for a zero magnitude input signal. For the embodiment illustrated in FIG. 2 the limit cycle period is given by:

$$T_0 = 2.R.C. \ln\{(1+H/(2.S_{MAX}))/(1-H/(2.S_{MAX}))\} \qquad (\text{eqn. 4})$$

where R is the resistance of impedance 204, C is the value of capacitance 205 (and R.C. is the time constant of the filter arrangement 203) and H is indicative of the amount of hysteresis applied by the hysteretic comparator 201.

The output PWM signal $S_{PWM}$ thus encodes the level of the input signal $S_{IN}$ as the duty cycle of one of the pulses of output state, i.e. as $\alpha/(\alpha+\beta)$.

Referring back to FIG. 1 the PWM signal $S_{PWM}$ is input to TDC 102 which produces one or more count values $S_{CT}$. In some embodiments the TDC 102 may provide separate count values of the durations $\alpha$ and $\beta$ of the pulses of each output state. For instance the TDC 102 may comprise first and second counters arranged to provide count values for the durations $\alpha$ and $\beta$ of pulses of the first state and the second state respectively and output the separate count values as the count signal $S_{CT}$. Additionally or alternatively the TDC 102 may determine a count value for the cycle period T, i.e. a count value equivalent to $\alpha+\beta$.

The TDC 102 is configured to receive the clock signal $S_{CLK}$ output from the clock generator 103 and to count the number of clock cycles of the clock signal $S_{CLK}$ in the periods of the first state and second state of the PWM signal $S_{PWM}$.

In some embodiments the frequency of the clock signal $S_{CLK}$ may, in at least one mode of operation, be relatively low. It will be understood that the frequency of the clock signal $S_{CLK}$ determines the resolution of the count value. The greater the frequency of the clock signal $S_{CLK}$ the greater the resolution to which the relevant durations can be determined. However operating at a relatively high clock speed will consume more power in operating the TDC 102. For detecting whether there is any signal activity of interest a high resolution signal is not required and thus operating with a relatively low frequency for the clock signal $S_{CLK}$ can avoid wasting power.

In some embodiments the frequency of the clock signal $S_{CLK}$ may, in at least a first mode of operation, be of the order of the limit cycle frequency $f_0$ of the first TEM 101. This means for an input signal $S_{IN}$ of zero magnitude, the first TEM 101 will produce a PWM signal $S_{PWM}$ with a cycle period T $(\alpha+\beta)$ equal to the period of the clock signal $S_{CLK}$.

Thus as long as the input signal was relatively low it would be expected that the cycle frequency of the PWM signal $S_{PWM}$ would remain similar to the frequency of the clock signal $S_{CLK}$. In such a case a count value corresponding to the number of pulses of the clock signal $S_{CLK}$ in a duration equal to the PWM signal $S_{PWM}$ cycle period T $(\alpha+\beta)$ would be expected to be equal to a value of one on average. However as the magnitude of the input signal $S_{IN}$ increases, the duration of the pulse of one of the output states will increase, as will the overall cycle period T, i.e. the frequency of the PWM signal $S_{PWM}$ will decrease. Thus the count value of the number of pulses of the clock signal $S_{CLK}$ in the cycle period T $(\alpha+\beta)$ would be expected to be greater than one on average.

The activity monitor 104 may thus receive the count signal $S_{CT}$ from the TDC 102 comprising one or more count values and determine whether the count signal $S_{CT}$ indicates that the signal activity level is above a predetermined threshold. In some embodiments the activity monitor 104 may monitor a value corresponding to the cycle period T, i.e. a value equal to $\alpha+\beta$. For example the activity monitor 104 may determine if this value is greater than a threshold value.

Using a value corresponding to the cycle period, i.e. a value of $\alpha+\beta$, is advantageous as such a value increase with signal magnitude (of either polarity) and varies according to the square of the signal magnitude, as discussed above in relation to equation (3). The square of signal magnitude is related to the signal power, which is of interest for activity detection, so using the cycle period, i.e. a value of $\alpha+\beta$, inherently and advantageously provides a square term without any computational effort.

It will be appreciated that there is a trade-off between the frequency of the clock signal $S_{CLK}$ in the first mode M1, and hence power consumption, and either the speed of detecting any signal activity of interest and/or the threshold at which signal activity of interest is detected. If the clock cycle period is effectively the same as the limit cycle of the PWM signal $S_{PWM}$ then the input signal level needed to generate a count value of two say is relatively high. Thus if the activity monitor 104 were simply to detect a count value above one then this may only indicate a relatively high level of signal activity. Additionally or alternatively the activity monitor 104 could average the values of the count signal $S_{CT}$ over a period of time to detect low level signal activity, but this may mean that detecting the signal activity takes a relatively long time. The response time could be increased by using a clock frequency in the first mode M1 which is higher than the limit cycle frequency but at the expense of increased power consumption.

In some implementations a gain applied to the input signal $S_{IN}$ and/or a conversion gain of the first TEM 101 (not separately illustrated) could be increased in the first mode so as to allow the first TEM 101 to be more sensitive to any increases in signal level of the input signal $S_{IN}$.

In any case, in the event that the activity monitor 104 detects any signal magnitude of interest an appropriate control signal EN may be generated to enable or wake other components of a speech processing circuit.

In some embodiments, on detection of any significant signal activity the activity monitor 104 may also change the mode of operation from a first mode of operation, with a first frequency for the clock signal $S_{CLK}$ to a second mode of operation with a second, higher frequency for the pulse signal $S_{CLK}$.

As noted above the frequency of the clock signal $S_{CLK}$ effectively determines the resolution of the TDC 102. Whilst a relatively low clock frequency is sufficient for determining whether there is any activity of interest and a lower clock frequency is advantageous for allowing low power operation, once signal activity of interest is detected it can be advantageous to swap to a second, higher resolution, mode M2 of operation to provide more useful information about the actual signal.

The activity monitor 104 may therefore generate a mode control signal, MODE, for controlling a mode of operation of the clock generator 103 so as to increase the frequency of the clock signal $S_{CLK}$.

Figure 4:
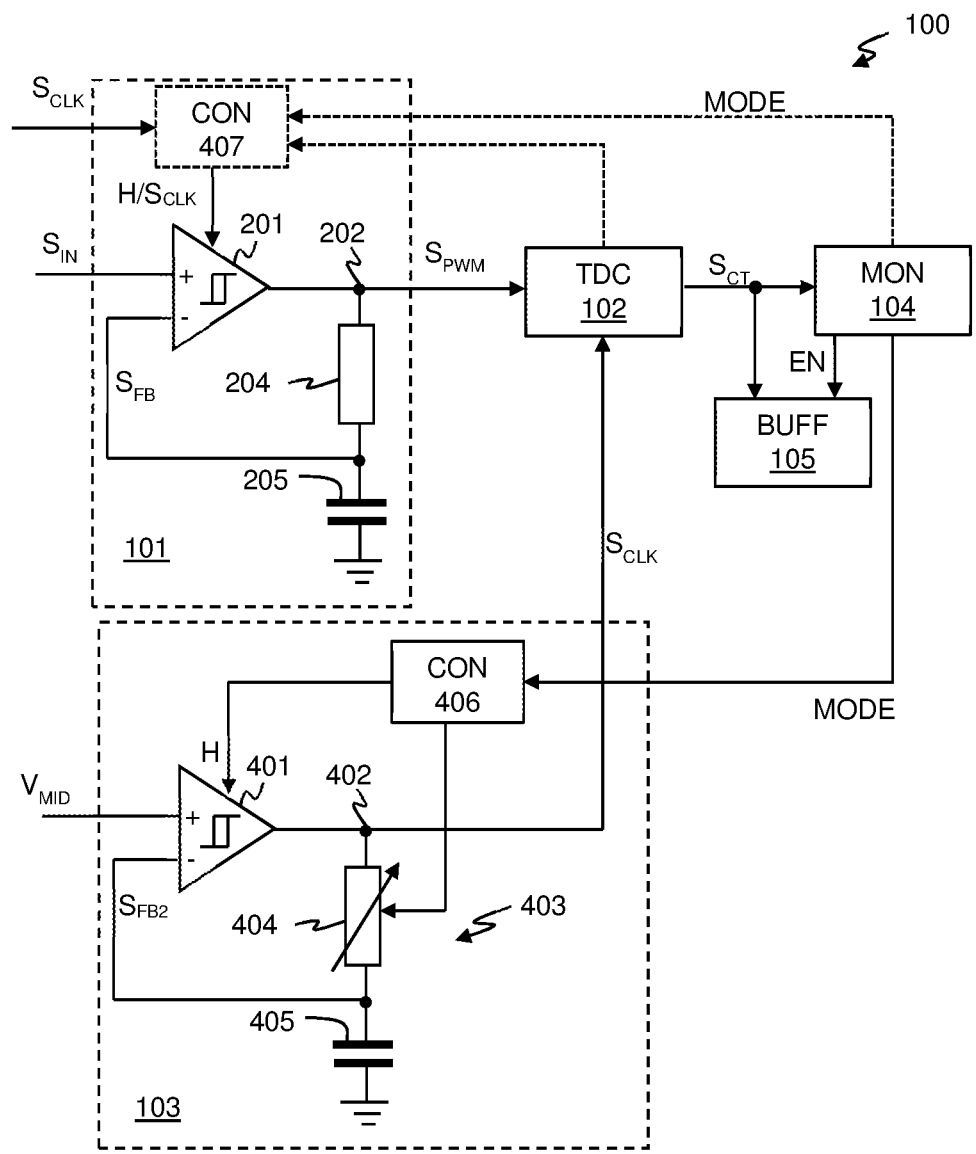
FIG. 4 illustrates an activity detector according to another embodiment.

As mentioned above in some embodiments the clock generator 103 may comprise a second time-encoding modulator (TEM2), as illustrated in FIG. 4. FIG. 4 illustrates that the first time-encoding modulator (TEM1) 101 for receiving the input signal $S_{IN}$ is a hysteretic comparator based TEM such as described with reference to the FIG. 2, and the clock generator 103, i.e. the second time-encoding modulator (TEM2), has the same basic topology. Thus the clock generator 103 comprises a hysteretic comparator 401 which, as mentioned above receives the midpoint voltage $V_{MID}$ at a first comparator input (+) and a feedback signal $S_{FB2}$ at a second comparator input (−). A loop filter arrangement 403 comprising, in this example, resistor 404 and capacitor 405, provides filtering, in this example, for the feedback path from the output node 402. As discussed above this will generate a PWM signal with a 50% duty cycle as the clock signal $S_{CLK}$. Using the same basic topology for the clock generator 103 and first TEM 101 means that any process or temperature variations will likely effect both circuits equally and provide good immunity. Likewise any power supply variation will impact both the first TEM 101 and clock generator 103. This particular TEM configuration for the first and second time encoding modulators, each with the loop filter arranged to filter the feedback path, thus provides a low power and small clock generator arrangement with at least adequate performance.

To provide control over the output frequency of the PWM clock signal $S_{CLK}$ the clock generator TEM 103 may comprise controller 406 for controlling the limit cycle frequency $f_0$ of the clock generating TEM 103. In some embodiments the controller 406 may comprise a hysteresis controller for controlling a value of hysteresis H applied by the hysteretic comparator 401. As noted above in equation (4) the limit cycle period $T_0$, and hence frequency $f_0$, depends on the amount of hysteresis H applied by the hysteretic comparator 401. Varying the amount of hysteresis applied will thus vary the limit cycle frequency $f_0$ of clock generating TEM 103 and hence the frequency of the clock signal $S_{CLK}$. There are many ways the hysteresis applied by a hysteretic comparator 401 may be varied as will be understood by one skilled in the art.

Additionally or alternatively at least one component of the loop filter 403 of the clock generator TEM 103 may be configurable so as to vary a time constant associated with the filter 403. For instance as illustrated in FIG. 4 the resistor 404 could comprise a variable resistance with a resistance value controlled by controller 406. Varying the resistance of the variable resistor 404 changes the RC time constant of the filter 403 and thus varies the limit cycle of the clock generator TEM 103. Generally the resistor 404 may be matched to the resistance of the corresponding filter resistor 204 of the first TEM 101 to provide the matching benefits discussed above. However in some implementations it may not be practical or advantageous to change the frequency of the clock generator TEM 103 by a sufficient amount by changing the hysteresis of the hysteretic comparator 401 and thus it may be desirable to vary the properties of the loop filter and/or it will of course be appreciated that components of the loop filter 403 may additionally or alternatively be configurable, such as the capacitor 405.

Controlling the hysteresis applied by the hysteretic comparator 401 and/or the time constant of the loop filter 403 can result in a very rapid change in frequency of the clock signal $S_{CLK}$ to a new stable frequency, e.g. from a first lower frequency to a second higher frequency. The TDC 102 will thus very rapidly be clocked at the higher second frequency upon detection of any significant signal activity in the input signal $S_{IN}$ and thus will start producing count values of the periods α and β of the pulses of the different output state in the PWM signal $S_{PWM}$. These count values can be demodulated to provide an indication of the level of the input signal $S_{IN}$, for instance as $x=(α−β)/(α+β)$.

By switching quickly to the second mode of operation with a higher frequency when any signal activity of interest is detected, the activity detector 100 can thus provide relatively high resolution data from the TDC 102 which can provide useful information about the signal of interest.

Thus in the first operating mode M1 the clock signal $S_{CLK}$ may have a frequency which is relatively low, to allow low power operation, but which is sufficient to allow detection of any signal activity of interest in the input signal. In some implementations the clock frequency in the first mode M1 could be of the order of a few tens or hundreds of kilohertz, say of the order of 100 kHz. As mentioned above this could be similar in frequency to the limit cycle frequency of the first TEM 101. In this M1 mode the activity detector thus effectively samples the input signal $S_{IN}$ at a maximum sample rate of the limit cycle frequency $f_0$ of TEM 101, say 100 kHz and the TDC provides a relatively crude and low resolution indication of signal level which is sufficient to detect any activity of interest.

If activity of interest is detected the activity detector may swap to a second mode M2 of operation. In the second mode of operation the first TEM 101 may operate with substantially the same limit cycle frequency but the frequency of the clock signal may be increase significantly, say to the order of several hundred kilohertz or a few megahertz of so, say around 1 MHz. In this M2 mode of operation the first TEM 101 and TDC 102 collectively provide a relatively high resolution representation of the input signal $S_{IN}$.

Some embodiments may also provide additional modes of operation with different clock frequencies. For instance a third mode M3 of operation could correspond to a high performance mode with a relatively high frequency for the clock signal, say of the order of a few tens of megahertz or so.

In some embodiments at least one timing parameter of the first TEM 101 may also be controlled in the second mode of operation. The activity detector 100 may therefore comprise a timing controller 407 for controlling the timing parameter of the first TEM 101.

In some embodiments the timing parameter may be related to frequency limits and the timing controller 407 may be configured to control the first TEM 101 so as to maintain the cycle frequency of the PWM signal $S_{PWM}$ within defined frequency limits, i.e. no greater than a desired maximum frequency and/or no lower than a certain minimum frequency. In some embodiments the frequency of the PWM signal $S_{PWM}$ may be controlled by controlling the hysteresis H of the hysteretic comparator 201 of the first TEM 101. The controller 407 may therefore comprise a hysteretic controller for controlling the hysteresis H applied by the hysteretic comparator 201. The hysteretic controller 407 of TEM 101 may be configured to control the hysteresis applied in the second mode of operation based on an indication of signal level so as to maintain the overall cycle period within certain limits, and hence the cycle frequency within the desired frequency limits. In particular a hysteretic controller 407 of the first TEM 101 may be responsive to the output of the TDC 102. As mentioned above as the level of the input signal changes the durations α and β of the pulses of the different output state in the PWM signal $S_{PWM}$ will vary, as will the overall cycle period. For a given frequency of clock signal this can therefore vary the count values that the TDC 102 may need to count to. In the second mode of operation the hysteretic controller 407 of TEM 101 may therefore control the hysteresis applied to keep the durations, and hence count values, within defined limits. In the second mode of operation it is the respective duty cycle of the pulses, e.g. α/(α+β) or (α−β)/(α+β) that provides the information of interest, and thus the limit cycle frequency can be varied in this mode of operation and then revert to a default setting in the first mode of operation where a variation in the overall cycle period may be of more interest. Controlling the PWM cycle frequency can usefully prevent tones from folding, or mixing, down into the signal band of interest in the second mode of operation.

In some embodiments when the activity monitor 104 determines that there is signal activity of interest the activity monitor 104 may enable the buffer 105. The buffer 105 may be selected to be a buffer that can be activated quickly and without undue power requirements on start up.

When the activity monitor 104 detects signal activity of interest the mode of operation may therefore be changed to increase the clock frequency so as to improve the resolution of the TDC 102 and the improved resolution output signal $S_{CT}$ from the TDC 102 may be input into the buffer 105. As mentioned above this avoids the loss of any significant audio data of interest, but disabling the buffer when there is no signal activity avoids buffering, i.e. storing, data which effectively corresponds to background noise or silence and the power costs associated therewith.

The data stored in the buffer can be used to initialise other parts of the speech processing system, for instance to provide information about the noise characteristics of the audio signals that may increase the speed at which other components can be initialised.

Additionally or alternatively the data stored in the buffer 105 may be processed by other components of the speech processing modules when enabled, for instance to confirm whether or not the audio signal $S_{IN}$ has the characteristics of speech and/or is a match for a trigger phrase.

The use of a TEM based activity detector to allow a buffer to be controlled, e.g. enabled/disabled, with the consequent power savings, whilst still providing always-on voice functionality represents a novel aspect of at least some embodiments of the invention.

Referring back to FIG. 2 the time-encoding modulator illustrated therein is particularly useful for embodiments of the invention, as the TEM 101 can be implemented as a low power element and which can be implemented as a relatively small, and hence low cost, circuit, e.g. as part of an integrated circuit. The TEM illustrated in FIG. 2 is a form of self-oscillating modulator in which, in at least the first mode of operation, the signal transitions of the PWM signal may be unconstrained.

Figure 5:
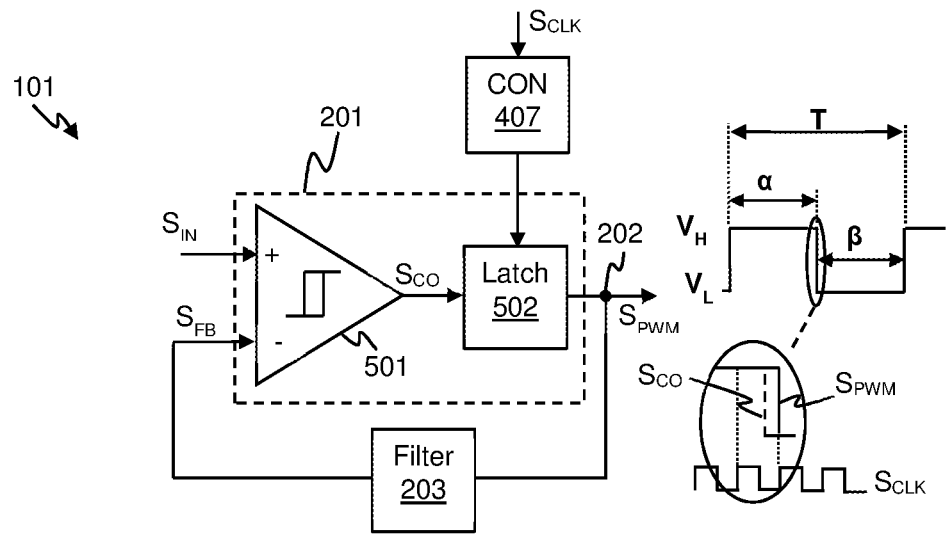
FIG. 5 illustrates a hysteretic comparator time-encoding modulator synchronised to a clock signal.

In some embodiments however the timing parameter of the first time-encoding modulator 101 may be the timing of signal transitions of the PWM signal $S_{PWM}$. In some embodiments therefore the timing controller 407 may be configured such that in the second mode of operation the first TEM 101 is constrained so that signal transitions of the PWM signal $S_{PWM}$ are synchronised to the clock signal $S_{CLK}$. In particular the hysteretic comparator 201 may comprise a latched hysteretic comparator module as illustrated in FIG. 5. FIG. 5 illustrates that the hysteretic comparator 201 may be a latched hysteretic comparator module that, in the second mode of operation, receives the clock signal $S_{CLK}$ from the controller 407 and which synchronises transitions in the PWM signal $S_{PWM}$ to the received clock signal $S_{CLK}$. This means that the durations α and β of the pulses of PWM signal, as well as the overall cycle period T, are integer multiples of the period of the clock signal $S_{CLK}$.

To illustrate this principle FIG. 5 shows that the latched hysteretic comparator 201 may comprise a comparator 501 and latch 502. The comparator 501 may operate in the same manner as discussed in relation to FIG. 2 to produce a comparator output $S_{CO}$ which will vary between the two output states, e.g. $V_H$ and $V_L$. The comparator output $S_{CO}$ is supplied to the latch 502 which, in the second mode of operation, is clocked by the clock signal $S_{CLK}$. In this example the comparator 201 will transition from one output state to the other as soon as the feedback signal $S_{FB}$ at the second comparator input exceeds the input signal $S_{IN}$ at the first comparator input by H and will remain in that state until the feedback signal $S_{FB}$ drops below the input signal $S_{IN}$ by H. The output of the hysteretic comparator 501 itself thus transitions as soon as the relevant threshold defined by the hysteresis is reached.

The latch 502 will change state following a change in state of the output $S_{CO}$ of the comparator 501, but will do so at a time defined by the clock signal $S_{CLK}$. The latch 502 may be effectively configured to sample the comparator output $S_{CO}$ at a sample period defined by the clock signal $S_{CLK}$ and to maintain that value as its output until the next sample period.

FIG. 5 illustrates the general form of the waveform of the time-encoded signal $S_{PWM}$ which is generated at the output node 202. FIG. 5 also illustrates, in an expanded form, an example of a possible relationship between the output signal $S_{PWM}$ and the output $S_{CO}$ of the comparator 501 at the transition from the high output state to the low output state, in this instance in the second mode where the frequency of the clock signal $S_{CLK}$ is greater than the cycle frequency of the PWM signal $S_{PWM}$. In this example the latch 502 may sample the output $S_{CO}$ of the comparator 501 at periods defined by a rising edge of the clock signal $S_{CLK}$. It can be seen that at a first sample period defined by a rising edge of the clock signal $S_{CLK}$, the output $S_{CO}$ of the comparator 501 is still in the high state and so the latch 502 maintains its output in the high state. Subsequently, before the next sample period, the differential between the input signal $S_{IN}$ and the feedback signal $S_{FB}$ reaches the relevant threshold and thus the output $S_{CO}$ of the comparator 501 changes at that point in time, as indicated by the dashed line. However the latch 502 maintains its output in the high state until the next sample period. At this point the latch 502 samples the output $S_{CO}$ of the comparator 501 and switches to the low output state.

It will thus be appreciated that the output from the latch 502, and hence from the latched hysteretic comparator 201, will still be a PWM signal with cycle-by-cycle durations of α and β of the first and second output states, but in this case the durations α and β and hence the overall cycle period T will be integer multiples of the period of the clock signal $S_{CLK}$.

In the first mode of operation however the signal transitions of the latched hysteretic comparator module 201 may be substantially unconstrained. In the first mode the timing controller 407 may provide a control signal to the latch 502 such that the latch changes states as soon as comparator output $S_{CO}$ changes state. In an alternative first mode of operation the latch may be bypassed under the control of controller 407 in which case the output $S_{CO}$ of the comparator 501 represents the PWM signal $S_{PWM}$.

It should be noted that the comparator 501 and latch 502 have been illustrated as separate components for ease of description. In some embodiments the latched hysteretic comparator module 201 may be implemented with a distinct hysteretic comparator 501 and latch 502 as illustrated. In some embodiments however the hysteretic comparator 201 may comprise a comparator element which is itself latched, i.e. which receives the clock signal and which transitions between output states based on the comparison and at a time defined by the clock signal $S_{CLK}$. In which case there may not be a separate comparator output signal $S_{CO}$. There are various ways in which the latched hysteretic comparator 201 could be implemented. One skilled in the art will be well aware of how to implement a comparator with hysteresis and to ensure that transitions in the output time-encoded signal $S_{PWM}$ are synchronised to a clock signal.

Constraining the time-encoded signal $S_{PWM}$ which is output from the hysteretic comparator module 201 to change state at a time synchronised to the clock signal $S_{CLK}$ in the second mode of operation may result in the durations α and β possibly being different from what they might otherwise have been, introducing a quantisation error.

However it will be noted that the feedback signal $S_{FB}$ is derived from the PWM signal $S_{PWM}$ at the output node 202 which is synchronised to the clock signal.

As noted above the output $S_{CO}$ of comparator 501 would change state as soon as the relevant differential voltage threshold is reached. However the output PWM signal $S_{PWM}$ will, in this example of the second mode of operation, only change state at the next relevant clock edge of the clock signal $S_{CLK}$. This can be seen as introducing an error in the duration of the relevant pulse, e.g. in the duration α by extending the duration. However, as the feedback signal $S_{FB}$ is derived from the synchronised PWM signal $S_{PWM}$, the feedback signal will continue to change in the same direction, thus increasing the differential voltage between the feedback signal $S_{FB}$ and the input signal $S_{IN}$ beyond the threshold and will only swap to start reducing the difference when the PWM signal $S_{PWM}$ changes state. At the point at which the PWM signal $S_{PWM}$ changes state, the magnitude of the feedback signal will thus be greater in magnitude than otherwise would have been the case. Therefore, the amount of change in the feedback signal $S_{FB}$ that is required to reach the relevant threshold for the comparator 501 to swap back to the other output state will also be greater. It can therefore be seen that the error introduced by extending the duration α to synchronise with a clock edge of the first clock signal $CLK_1$ is, in effect, carried forward into determination of the duration β in a way that maintains the duty cycle.

Such an arrangement provides a time-encoded signal $S_{PWM}$ which, in the second mode of operation, may be synchronised to the clock signal $S_{CLK}$. This means that the durations of pulses of the time encoded signal $S_{PWM}$ can be supplied directly to a counter of TDC 102 that is also synchronised to the clock signal, as illustrated in FIG. 6.

Figure 6:
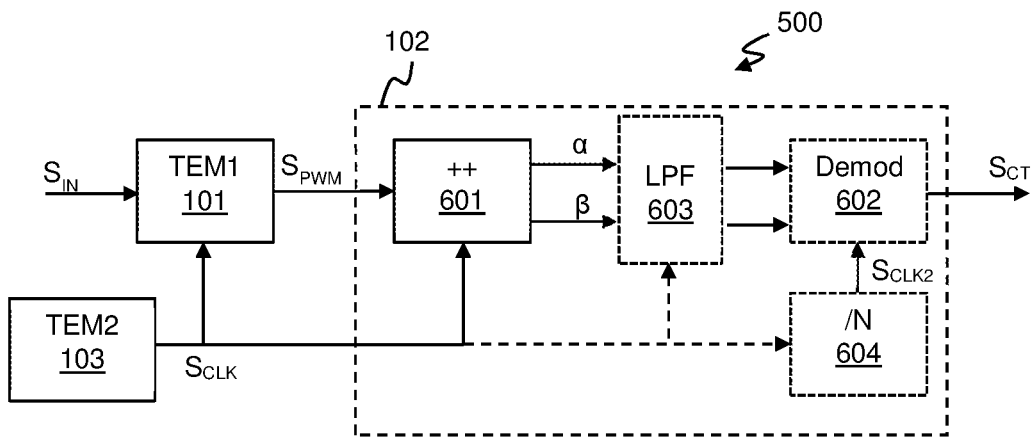
FIG. 6 illustrates an example of activity detector with a time-encoding modulator synchronised to a clock signal.

FIG. 6 also illustrates that the TDC 102 may comprise a counter 601 which is synchronised to the clock signal $S_{CLK}$. In the first mode of operation the counter may count the number of periods of the clock signal $S_{CLK}$ in the periods defined by the first PWM signal $S_{PWM}$. In the first mode the signal transitions in the PWM signal $S_{PWM}$ may be unconstrained and thus may be unsynchronised to signal transitions in the clock signal $S_{CLK}$. In the first mode however the activity detector is simply determining whether the instantaneous and/or average count value is above some threshold value. In the second mode of operation the signal transitions in the first PWM signal $S_{PWM}$ may be synchronised to the clock signal $S_{CLK}$ which is used for clocking the counter. The periods of the PWM signal $S_{PWM}$ will thus be exact multiples of the period of the clock signal $S_{CLK}$ and hence there will be no quantisation error introduced by the counter 601. This arrangement may avoid any issues with unwanted tones from the PWM frequency being folded down into the signal band of interest. In some implementations the count values from counter 601 may be output from the TDC 102 as the count signal $S_{CT}$. In some implementations however the TDC 102 may comprise a demodulator 602 for, at least in the second mode of operation, deriving a value for the input signal based on the count values, possibly after filtering e.g. by low pas filter 603. The demodulator may operate at a frame rate at a lower clock frequency, which may be synchronised to the clock signal $S_{CLK}$. In some implementations a frequency divider 604 may produce a second clock signal $S_{CLK2}$ as a frequency divided version of the clock signal $S_{CLK}$. The second clock signal $S_{CLK2}$ may also, in some embodiments, be used to clock the buffer 105 when enabled.

In some embodiments the timing controller 407 may be operable in one variant of the second mode to control the frequency limits of the PWM signal $S_{PWM}$ without any other constraint on the timing of the signal transitions. In some embodiments the timing controller 407 may additionally or alternatively be operable in another variant of the second mode to control timing of the signal transitions of the PWM signal $S_{PWM}$ without any other constraint on the frequency limits. In some embodiments however the timing controller 407 may additionally or alternatively be operable in yet another variant of the second mode to control the frequency limits of the PWM signal $S_{PWM}$ and also a mode to control timing of the signal transitions of the PWM signal $S_{PWM}$.

In some embodiments at least some other aspects of operation of the first TEM 101 and/or second TEM may be controllable in a mode of operation. For instance in the first mode of operation the first TEM 101 and/or second TEM 103 may operate as described above to just detect any signal activity of interest. If activity of interest is detected the activity detector may switch to a higher performance mode of operation. This may be the described second mode of operation or could be a further mode of operation. For example the activity detector could switch to the second mode of operation on detection of signal activity and enable the buffer 105, control the clock generator TEM 103 to increase the clock frequency and optionally control at least one timing parameter of the first TEM. In due course the data stored in the buffer 105 could be analysed to determine whether the activity corresponds to speech of interest. If so the apparatus could be controlled to a different high performance mode of operation. In such a high performance mode of operation the clock frequency could be increased further still. Additionally or alternatively the topology of the first TEM 101 could varied in some way to improve performance. In some embodiments the first TEM 101 could be used as at least part of an analogue-to-digital conversion path for a main processing path for speech signals when speech activity is detected and various parameters of the first TEM 101 may be controlled to provide an adequately high performance ADC. It may therefore be necessary to synchronise the TDC 102 to a system clock in an active mode. In some embodiments the clock generator TEM 103 could comprise at least part of a clock module for a system clock in an active mode, for instance the clock generator TEM 103 could be used as at least part of a numerically-controlled-oscillator of a frequency-locked-loop for controlling a system clock in a high performance mode of operation.

Figure 7:
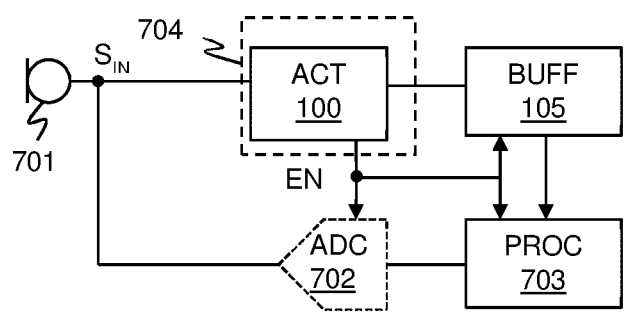
FIG. 7 illustrates one example of a processing path having an activity detector according to an embodiment.

It will therefore be appreciated that the activity detector according to embodiments may be used as an activity detector in a side path to a main processing path to detect activity in order to wake the components of the main processing path when required. The activity detector swaps to a higher performance mode when signal activity is detected to store data in buffer 105 during the period that the main processing path is being activated. Alternatively in some embodiments components of the activity detector could form part of the main processing path and, on detection of signal activity of interest, may change mode to a higher performance mode and may store data in the buffer whilst other components of the main processing path are being activated. FIG. 7 illustrates that a microphone 701 may be arranged to provide an analogue input signal $S_{IN}$ to activity detector 100 such as described above. When activity is detected the activity detector 100 may enable an ADC 702 of a main processing path and some processing module(s) 703. The buffer 105 may also be enabled to buffer or store data whilst the main processing path is being enabled. The processing module(s) 703 may process the audio signal to determine whether the activity corresponds to speech and in some embodiments whether the speech corresponds to a trigger phrase. The processing module(s) may also comprise speech and/or speaker recognition modules. The processing module(s), once enabled may read data from the buffer 105 as well as receiving new data from ADC 702. In some implementations however the activity detector 100 may be configurable to form part of a main path ADC 704 as discussed above, for providing data to the processing module(s) 703.

As noted above the activity detector of embodiments of the disclosure thus provides a number of advantages. The use of a time-encoded modulator, i.e. TEM, especially a TEM such as illustrated in FIG. 2 or 5, provides the ability for very low power operation. The use of the same or a similar TEM to generate the clock signals provides robust performance with respect to process and temperature variations and power supply variations.

The ability to quickly detect any signal activity of interest and transition to a higher resolution mode of operation means that the buffering, i.e. storing, of signals that are not of interest is not required, but data regarding the signal of interest can be buffered and can thus be made available when required.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

At least some embodiments may be implemented in a host device, especially a portable and/or battery powered host device. Some embodiments may be implemented in an electronic device which may comprise at least one of: a communication device, a mobile or cellular telephone, a smartphone; a computing device; a laptop, notebook or tablet computing device; a media player; a games device; a wearable device; a smartwatch; a voice controlled device.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. An activity detector for detecting signal activity in an input audio signal comprising:
    a first time-encoding modulator comprising a first hysteretic comparator for generating a PWM (pulse-width modulation) signal based on the input audio signal;
    a second time-encoding modulator comprising a second hysteretic comparator for receiving a reference voltage and generating a clock signal based on the reference voltage;
    a time-decoding converter configured to receive the clock signal, generate count values of a number of cycles of the clock signal in periods defined by the PWM signal and output a count signal based on said count values;

an activity monitor responsive to the count signal to determine whether the input audio signal comprises signal activity above a defined threshold; and wherein the second time-encoding modulator is configurable so as to vary a frequency of the clock signal and wherein the activity detector is configured so as to operate:

in a first mode, with the second time-encoding modulator controlled to generate the clock signal at a first frequency, when the input audio signal comprises no signal activity above the defined threshold; and in a second mode, with the second time-encoding modulator controlled to generate the clock signal at a second, higher, frequency when the signal activity above the defined threshold is detected.

2. The activity detector as claimed in claim 1 comprising a timing controller for controlling a timing parameter of the first time-encoding modulator in the second mode of operation.

3. The activity detector as claimed in claim 2 wherein said timing parameter of the first time-encoding modulator comprises frequency limits for a maximum frequency and/or a minimum frequency of the PWM signal.

4. The activity detector as claimed in claim 3 wherein said timing controller comprises a first hysteresis controller for controlling hysteresis applied by the first hysteretic comparator wherein, in the second mode of operation, the first hysteresis controller is responsive to the time-decoding converter to control the hysteresis applied by the first hysteretic comparator so as to maintain the frequency of the PWM signal within said frequency limits.

5. The activity detector as claimed in claim 2 wherein the timing parameter comprises the timing of signal transitions in the PWM signal.

6. The activity detector as claimed in claim 5 wherein, in the second mode of operation the timing controller is configured to synchronise any signal transitions in the PWM signal to said clock signal.

7. The activity detector as claimed in claim 6 wherein the first hysteretic comparator comprises a latched hysteretic comparator module and, in the second mode, the timing controller is configured to supply the clock signal to the latched hysteretic comparator module.

8. The activity detector as claimed in claim 1 wherein the reference voltage corresponds to a voltage level of zero signal magnitude of the audio input signal.

9. The activity detector as claimed in claim 1 wherein the second time-encoding modulator comprises a second hysteresis controller for controlling hysteresis applied by the second hysteretic comparator so as to control the frequency of the clock signal.

10. The activity detector as claimed in claim 1 wherein the second time-encoding modulator comprises a loop filter.

11. The activity detector as claimed in claim 10 wherein at least one component of the loop filter of the second time-encoding modulator is configurable so as to vary a time-constant of the loop filter so as to control the frequency of the clock signal.

12. The activity detector as claimed in claim 1 wherein the activity monitor is configured to receive the count signal and monitor a value related to a cycle period of the PWM signal derived from the count signal against a threshold.

13. An activity detector for detecting signal activity in an input audio signal comprising:

a first time-encoding modulator comprising a first hysteretic comparator for generating a PWM (pulse-width modulation) signal based on the input audio signal;

a second time-encoding modulator comprising a second hysteretic comparator for receiving a reference voltage and generating a clock signal based on the reference voltage;

a time-decoding converter configured to receive the clock signal, generate count values of a number of cycles of the clock signal in periods defined by the PWM signal and output a count signal based on said count values;

an activity monitor responsive to the count signal to determine whether the input audio signal comprises signal activity above a defined threshold; and a buffer configured to receive a version of the count signal from the time-decoding converter, wherein the activity monitor is configured to disable the buffer when the input audio signal comprises no signal activity above the defined threshold and to enable the buffer when the input audio signal comprises the signal activity above the defined threshold.

14. An audio circuit comprising an activity detector as claimed in claim 1.

15. The audio circuit as claimed in claim 14 comprising a microphone configured to provide the input audio signal to the activity detector.

16. The audio circuit as claimed in claim 14 comprising an analogue-to-digital converter configured to be enabled by the activity detector when the activity monitor indicates that the input audio signal comprises the signal activity above the defined threshold.

17. The audio circuit as claimed in claim 14 comprising a speech processing module configured to be enabled by the activity detector when the activity monitor indicates that the input audio signal comprises the signal activity above the defined threshold.

18. An activity detector for detecting signal activity in an input audio signal comprising:

a first time-encoding modulator configured to receive the input audio signal as an input and generate a first PWM (pulse-width modulation) signal based on the input audio signal;

a second time-encoding modulator configured to receive a reference voltage and generate a second PWM signal as a clock signal;

a time-decoding converter for counting a number of cycles of the clock signal in periods defined by the first PWM signal;

an activity monitor responsive to the time-decoding converter to determine whether or not the input audio signal comprises the signal activity above a defined threshold;

wherein the second time-encoding modulator is configurable so as to vary a frequency of the clock signal and wherein the activity detector is configured so as to operate:

in a first mode, with the second time-encoding modulator controlled to generate the clock signal at a first frequency, when the input audio signal comprises no signal activity above the defined threshold; and in a second mode, with the second time-encoding modulator controlled to generate the clock signal at a second, higher, frequency when the signal activity above the defined threshold is detected.

* * * * *